United States Patent [19]

Dingwall

[11] 3,886,464

[45] May 27, 1975

[54] SELF-BIASED COMPLEMENTARY TRANSISTOR AMPLIFIER

[75] Inventor: Andrew Francis Gordon Dingwall, Somerville, N.J.

[73] Assignee: RCA Corporation, New York, N.Y.

[22] Filed: June 1, 1973

[21] Appl. No.: 365,837

[52] U.S. Cl. .................... 330/13; 307/304; 330/15; 330/18; 330/22; 330/25; 330/35

[51] Int. Cl. .............................................. H03f 3/18

[58] Field of Search .......... 307/304; 330/13, 15, 17, 330/22, 35, 38 M, 18, 25

[56] References Cited

UNITED STATES PATENTS 3,392,341 7/1968 Burns............................. 307/304 X

*Primary Examiner*—R. V. Rolinec

*Assistant Examiner*—Lawrence J. Dahl

*Attorney, Agent, or Firm*—H. Christoffersen; S. Cohen

[57] ABSTRACT

A complementary symmetry field-effect transistor amplifier employs a feedback path between the input and output terminals thereof. A second pair of complementary symmetry field-effect transistors in series with the transistors of the amplifier is employed to control the operating potentials applied to the amplifier. In one form of the circuit, the signal employed for controlling the conductance of the second pair of transistors is the output signal of the amplifier.

13 Claims, 8 Drawing Figures

SELF-BIASED COMPLEMENTARY TRANSISTOR AMPLIFIER

This invention relates to amplifiers and particularly to amplifiers employing complementary field-effect transistors.

Complementary field-effect transistor (FET) circuits are widely used in digital logic applications. Such circuits are characterized, for example, in having high threshold levels, inherent structural simplicity, low power consumption and very high power gain.

It is known that a complementary FET inverter, for example, may be used in an analog amplifier when suitably biased and when so used it retains many of the desirable characteristics associated with its use in digital logic applications. Such amplifiers are customarily self-biased for analog applications by providing a feedback path from the output terminal to the input terminal thereof and are useful in a variety of applications requiring single amplification. On the other hand, they heretofore have not been employable in applications requiring more sophisticated operations such as summation or subtraction of pairs of input signals. Another shortcoming of such prior art amplifiers is that they are difficult to connect in cascade without resulting in undesired oscillations. The oscillations are caused, for example, by the relatively large feedback signals inherently present in the structure of the amplifier as well as in its biasing network.

A need exists for a complementary FET isolation amplifier suitable for use with prior art cascade connected complementary FET amplifiers for effectively reducing interstage feedback signals to allow cascade connection of the prior art amplifiers without resulting in feedback induced oscillations. In particular, a need exists for a complementary FET amplifier capable of producing an output signal which is jointly representative of a plurality of input signals for effectively providing addition of the input signals. A further need exists for a complementary FET amplifier capable of subtracting two input signals.

The preferred embodiments of the present invention include a complementary FET amplifier having a feedback path between its input and output terminals for establishing a quiescent operating point for the amplifier. Operating potentials are supplied to the amplifier in response to a control signal and these are changed in value, each in the same sense, in response to a change in value of the control signal. The control signal may be obtained from an external source or may be derived from the output signal produced by the amplifier. A pair of the amplifiers may be interconnected to provide differential amplification of two input signals.

The invention is illustrated in the accompanying drawings, of which:

FIG. 1 is a circuit diagram of a prior art complementary field-effect transistor amplifier.

FIG. 1*a* is a circuit diagram of a low-pass filter suitable for use with the circuit of FIG. 1.

Figure 1:
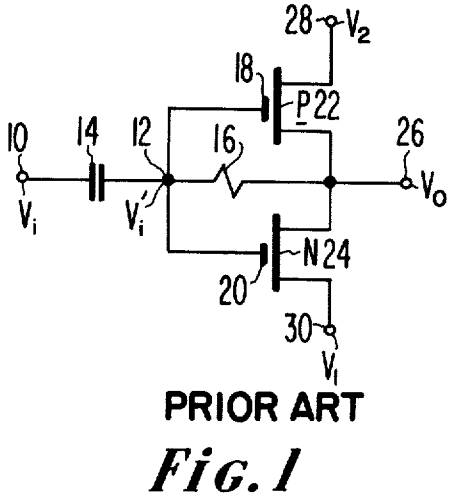
PRIOR ART FIG. 1

In the prior art complementary field-effect transistor amplifier of FIG. 1, input terminal 10 is coupled to circuit point 12 by means of capacitor 14. Circuit point 12 is coupled to one end of resistor 16 and to control electrodes 18 and 20 of complementary field-effect transistors 22 and 24, respectively. The conduction paths of transistors 22 and 24 are separately coupled between output terminal 26 and circuit points 28 and 30, respectively. The other end of resistor 16 is also coupled to output terminal 26.

In the following discussion of the operation of the prior art amplifier of FIG. 1, assume that transistors 22 and 24 are P and N type complementary enhancement-mode field-effect transistors, respectively, and that circuit points 28 and 30 receive operating potentials $V_2$ and $V_1$, respectively, where $V_2$ is a potential relatively positive compared to $V_1$. Assume also, initially, that no input signal is applied to input terminal 10.

Under the conditions stated, output terminal 26 will assume a potential determined by the relative conductivities of transistors 22 and 24 and the potentials $V_2$ and $V_1$ applied to circuit points 28 and 30, respectively. The relative conductivities of the conduction paths of transistors 22 and 24, depend in turn upon the potential applied to control electrodes 18 and 20, respectively. This potential $V_i'$ at circuit point 12 is provided by means of feedback resistor 16, coupled between output terminal 26 and circuit point 12.

If the potential at circuit point 12 is equal to the potential at output terminal 26, no potential difference will be developed across feedback resistor 16, therefore, no current will flow through that resistor. Since feedback resistor 16 provides the only source of direct current to circuit point 12, it follows that the potential $V_i'$ applied to control electrodes 18 and 20, will not change. Further the resistances of the conduction paths of transistors 22 and 24 being determined by the potentials applied to their respective control electrodes will not change either. Since the potential at output terminal 26 is determined by the resistances of the conduction paths of transistors 22 and 24, it follows that output voltage Vo at output terminal 26 also cannot change. In other words, if the potential $V_i'$ at the control electrodes of the complementary transistors is equal to the output voltage V*o* at output terminal 26 the circuit will be in a stable, quiescent operating condition.

If, on the other hand, it is assumed that the potential at circuit point 12 is greater than the potential at output terminal 26, the resistance of the conduction path of transistor 24 will be relatively smaller and the resistance of the conduction path of transistor 22 will be relatively greater than previously stated. The potential at output terminal 26 will thus tend to decrease, which, in turn, will result in an increased potential difference across feedback resistor 16 of such a sense as will tend to lower the potential at circuit point 12 as long as the potential at circuit point 12 is greater than the potential at output terminal 26.

If, on the other hand, it is assumed that the potential at circuit point 12 is lower than the potential at output terminal 26, the resistance of the conduction path of transistor 22 will be decreased while that of the conduction path of transistor 24 will be increased tending to raise the potential of output terminal 26, which, in turn, will provide a current through feedback resistor 16 to increase the potential at circuit point 12. Again, this action will continue until the potential at circuit point 12 is equal to the potential at circuit point 26. In other words, the action of feedback resistor 16 is such as to provide a negative feedback signal from the output terminal to circuit point 12, which signal will have a tendency to equalize the potentials at circuit point 12 and output terminal 26 and establish a stable operating point the value of which is determined by the resistance ratio of the conduction paths of transistors 22 and 24 and the operating potentials $V_2$ and $V_1$ applied to circuit points 28 and 30, respectively.

Consider now the operation of the prior art amplifier of FIG. 1 with an input signal $V_i$ applied to input terminal 10. An increase in voltage applied to input terminal 10 will be coupled to circuit point 12 by capacitor 14 causing an increase in voltage $V_i'$ at circuit point 12. This in turn will cause a decrease in the resistance of the conduction path of transistor 24 and an increase in the resistance of the conduction path of transistor 22, which will result in a decrease in voltage at output terminal 26. As previously described, with respect to the quiescent operating point of the prior art circuit, feedback resistor 16 will provide a negative feedback signal from output terminal 26 to circuit point 12. This negative feedback signal will tend to restore the potential at circuit point 12 to its previous value. The amount of feedback provided by feedback resistor 16 relative to input signals applied to input terminal 10, will be determined to a first approximation by the source impedance of the generator supplying the input signals to input terminal 10, the reactance of coupling capacitor 14 and the value of feedback resistor 16.

If one wishes to obtain maximum voltage gain from the prior art circuit, it is necessary that the value of feedback resistor 16 be large, compared to the source impedance of the generator providing the input signal to input terminal 10. Conversely, if one does not wish to obtain maximum voltage gain from the prior art circuit of FIG. 1, but wishes instead to obtain a voltage gain of a lower value and relatively independent of the particular transistor parameters involved, the value of feedback resistor 16 may be made more nearly equal to the generator source impedance. In general, however, to obtain maximum gain from the circuit it is necessary either that the resistance of feedback resistor 16 be very large, compared to the generator source impedance, or that some form of filtering technique be utilized to remove signal components from the feedback signal which pass through resistor 16. This may be accomplished, for example, by coupling a low pass filter between output terminal 26 and circuit point 12.

Figure 1A:
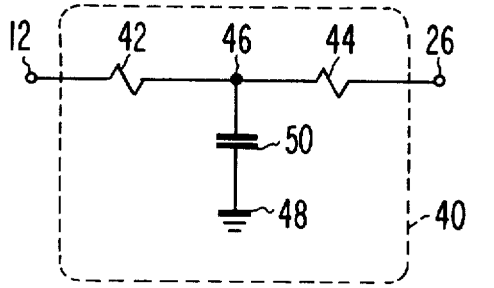
PRIOR ART FIG. 1a

FIG. 1a shows the use of a suitable low pass filter 40 coupled between circuit point 12 and output terminal 26. The filter includes resistors 42 and 44 serially coupled between circuit point 12 and output terminal 26 with the midpoint of the series 46 coupled to groundpoint 48 by means of capacitor 50. Low pass filter 40 has the characteristic of allowing direct current signals to pass from circuit point 12 to output terminal 26 for establishing the quiescent operating point of the prior art amplifier while at the same time removing signal currents from the path for obtaining maximum voltage gain from the amplifier.

Figure 2:
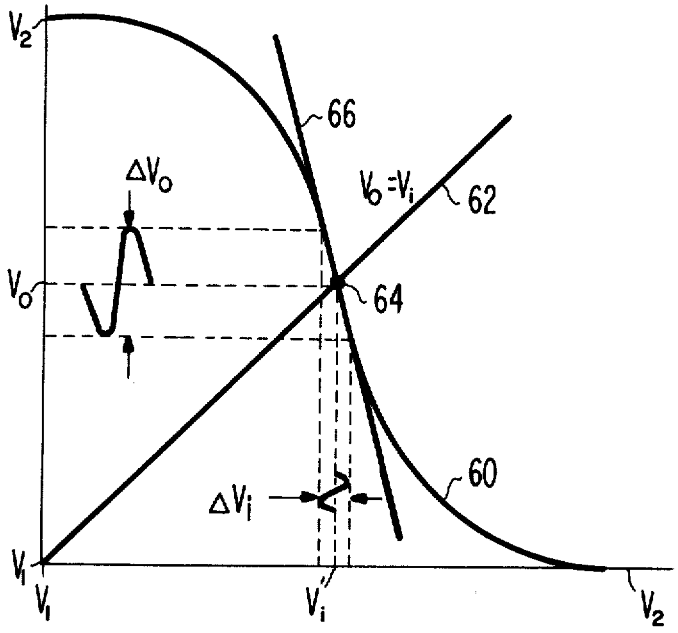
FIG. 2 is a typical transfer characteristic curve of the prior art amplifier of FIG. 1.

The static and dynamic operating characteristics of the prior art amplifier of FIG. 1, are illustrated by the transfer characteristic curve 60 of FIG. 2, where $V_o$ corresponds to the voltage produced on output terminal 26 and $V_i'$ corresponds to the potential at circuit point 12. Line 62 represents the condition $V_o = V_i'$ which, as previously discussed, represents the locus of stable operating conditions for the prior art amplifier in which the feedback potential across resistor 16 is zero. The intersection of line 62 with transfer function 60 defines a particular stable quiescent operating point 64 for the transfer function 60 shown. The slope of transfer function 60 at quiescent operating point 64, represented by line 66, is a measure of the open loop gain of the prior art amplifier.

An input signal $Vi$ applied to input terminal 10 results in a signal variation $\Delta V_i$ having an average value $V_i'$ at circuit point 12. This produces an output signal $\Delta V_o$ having an average value $V_o$ at output terminal 26. The relationship between $\Delta V_i \Delta V_o$ represents the gain of the prior art amplifier and is related to the slope of line 66 through operating point 64. The slope of line 66, in turn, depends upon the amount of signal feedback through feedback resistor 16 as previously discussed. Line 66 will have a maximum slope for signal variations applied to input terminal 10 if the value of feedback resistor 16 is large compared to the source impedance of the signal generator providing a signal to input terminal 10. In the alternative, as previously discussed, signal feedback may be minimized by replacing feedback resistor 16 with a low pass filter as shown in FIG. 1a for maximizing the slope of line 66 and, hence, the voltage gain of the prior art amplifier.

In summary, FIG. 2 illustrates that the voltage gain of the prior art amplifier is determined by the slope of line 66 through quiescent operating point 64. The quiescent operating point is established by providing feedback from output terminal 26 to circuit point 12 and the slope of line 66 is maximized by minimizing the signal feedback currents through the feedback path by either using a large feedback resistor or by replacing the feedback resistor with a suitable low pass filter. It is seen that if the slope of line 66 is greater than −1, that a signal input $\Delta V_i$ will be amplified and inverted producing an output signal $\Delta V_o$ at output terminal 26.

Figure 3:
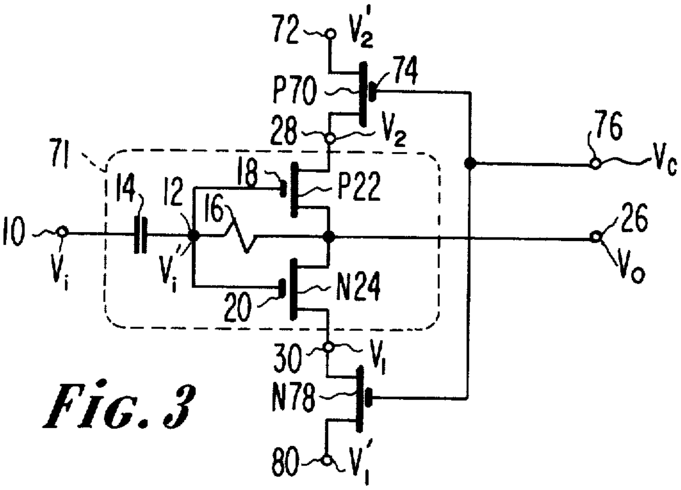
FIG. 3 is a circuit diagram of one embodiment of the invention.

FIG. 3, embodying the present invention, incorporates the prior art amplifier of FIG. 1 where like numerals designate like elements. In addition, it includes P type field effect transistor 70 having its conduction path coupled between circuit point 28 and circuit point 72 and the control electrode 74 thereof coupled to control terminal 76. N type transistor 78 has its conduction path coupled between circuit point 30 and circuit point 80 with the control electrode thereof also coupled to control terminal 76.

The prior art amplifier indicated in dash box 71 operates in the manner previously described in response to potentials $V_1$ and $V_2$ applied to circuit points 30 and 28, respectively, and the input signal $V_i$ applied to input terminal 10.

The function of the additional P and N type transistors 70 and 78, respectively, is to provide a means for translating the potentials $V_2$ and $V_1$ respectively, in response to a control signal applied to control terminal 76. If, for example, $V_1'$ and $V_2'$ are fixed operating potentials applied to circuit points 80 and 72, respectively, and $V_2'$ is relatively positive compared with $V_1$, and if an increasingly positive voltage is applied to control terminal 76, the impedance of the conduction path of transistor 78 will decrease while that of the conduction path of transistor 70 will increase. This will, in effect, translate the voltages $V_2$ and $V_1$ toward the potential $V_1'$ at circuit point 80, conversely, if a relatively decreasing signal is applied to circuit point 76, the impedance of the conduction path of transistor 70 will decrease while that of the conduction path of transistor 78 will increase, effectively translating the potentials $V_2$ and $V_1$ toward the value of the fixed potential $V_2'$ at circuit point 72. Since the quiescent operating point of prior art amplifier 71 is determined in part by the potentials $V_1$ $V_2$ at circuit points 30 and 28, respectively, and since these potentials are translated in accordance with the signal provided to control terminal 76 as just described, it follows that the signal produced at output terminal 26 of the prior art amplifier will be representative both of the input signal applied to input terminal 10 and of the control signal applied to a control terminal 76. This feature is utilized to advantage in the present invention, as will be subsequently described, to form inverting-summing amplifiers, interstage isolation amplifiers, and differential amplifiers.

Figure 4:
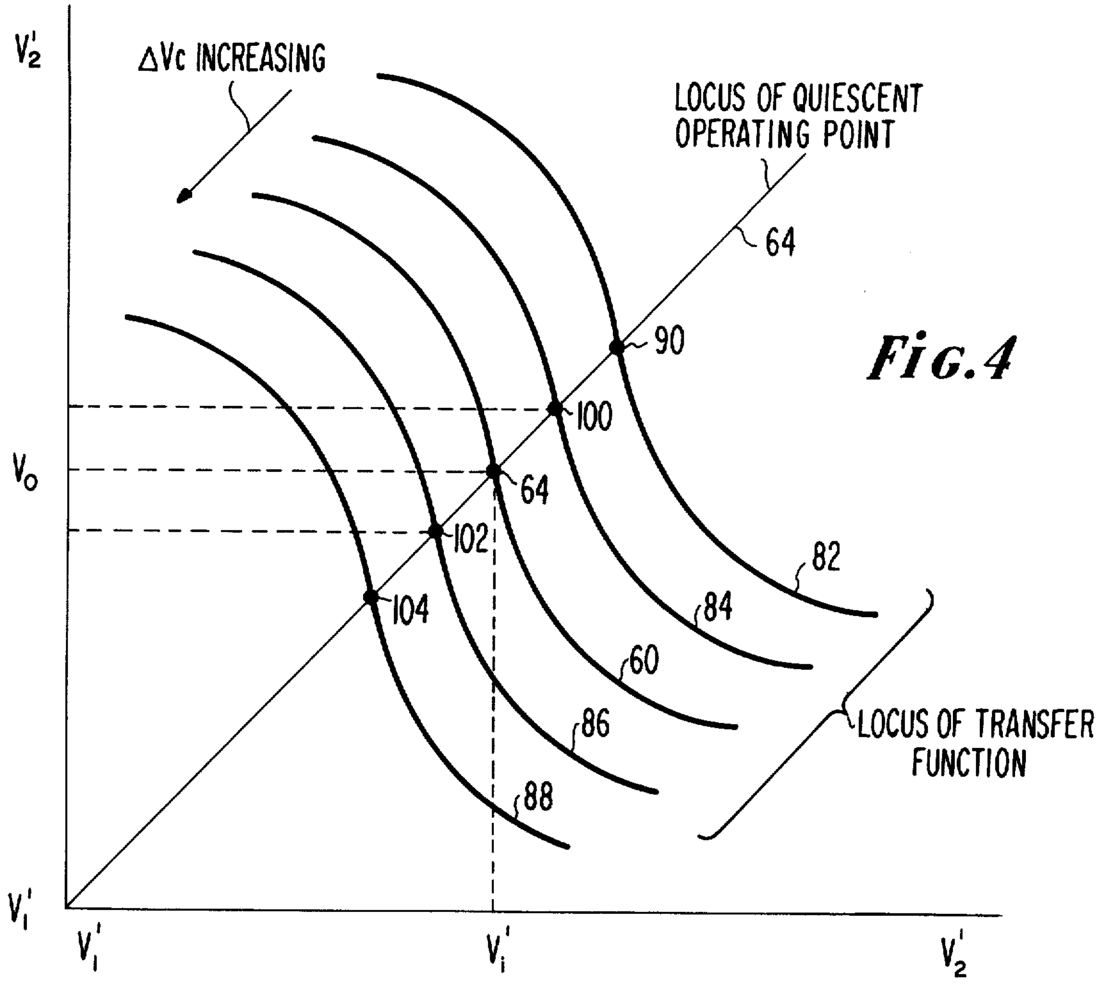
FIG. 4 shows a family of functions for the circuit of FIG. 3.

FIG. 4 further illustrates the invention embodied in the circuit of FIG. 3. It is seen there that output voltage Vo at output terminal 26 is functionally related to input voltage $V_i'$ at circuit point 12 by a family of transfer functions such as 82, 84, 60, 86, and 88, which have corresponding quiescent operating points 90, 100, 64, 102, and 104, respectively. As was discussed with respect to the transfer function of FIG. 2, each of the aforementioned operating points on line 64 represents the condition $Vo = V_i'$.

The circuit of FIG. 3, for a given value of control voltage Vc applied to control terminal 76, will have a given transfer function, for example, transfer function 60 in FIG. 4. If the control voltage applied to control terminal 76 increases, for example, the effect of this increase, as previously explained, is to translate voltages $V_1$ and $V_2$ in the direction of $V_1'$ in FIG. 3, this may correspond, for example, to transfer function 86 and corresponding operating point 102. Conversely, if the control voltage $Vc$ decreases at control terminal 76, voltages $V_1$ and $V_2$ are translated positively towards the value $V_2'$. Due to the action of feedback resistor 16, or low pass filter 40, as previously explained, the locus of the quiescent operating point must lie on line 64, which represents the condition $Vo = V_i'$. Thus, the output voltage $Vo$ produced at output terminal 26 is seen to vary inversely with both $V_i'$ and the control voltage applied to control terminal 76.

Referring again to FIG. 3, an input signal applied to input terminal 10 and a control signal applied to control terminal 76, has been seen to produce an output signal at output terminal 26 representative of the inverted sum of the two input signals. Transistors 22 and 24 of the prior art amplifier 71 perform the function of amplifying the input signal applied to input terminal 10 and inverting it while transistors 70 and 78 perform the function of amplifying the signal applied to control terminal 76, which is effectively summed at output terminal 26 by translating voltages $V_1$ and $V_2$ at circuit points 30 and 28, respectively.

Neglecting the effect of feedback resistor 16, the small signal voltage gain of the circuit of FIG. 3 may be expressed, to a first approximation, as:

$$Vo = -A_1V_i - A_2V_c$$

where:

$Vo$ is the output signal at output terminal 26
$V_i$ is the input signal at input terminal 10
$-A_1$ is the effective amplification factor of transistor pair 22 and 24
$-A_2$ is the effective amplification factor of transistor pair 70 and 78 and
$V_c$ is the control voltage applied to control terminal 76 further, if output terminal 26 is connected to control terminal 76:

$$V_o = V_c$$

therefore, $$Vo = -A_1V_i - A_2Vo$$

$$V_o(1+A_2) = -A_1V_i$$

so that:

$$V_o/V_1 = -A_1/1+A_2$$

and, if, for example, $$A_1 = A_2 \text{ and } A_2 >> 1$$

then $$(Vo/V_i) \approx -1$$

This latter small signal gain expression indicates that the circuit can perform, under appropriate conditions, the function of a unity gain inverting amplifier for signals presented to input terminal 10. Such an amplifier can be used, for example, as an interstage coupling element for isolating other prior art amplifiers, as previously suggested, for reducing inter-stage feedback signals which might otherwise result in instability or oscillation. Further, such a unity gain inverting amplifier may be combined with a second, similar circuit for providing differential amplification of two input signals as will be subsequently described.

Figure 5:
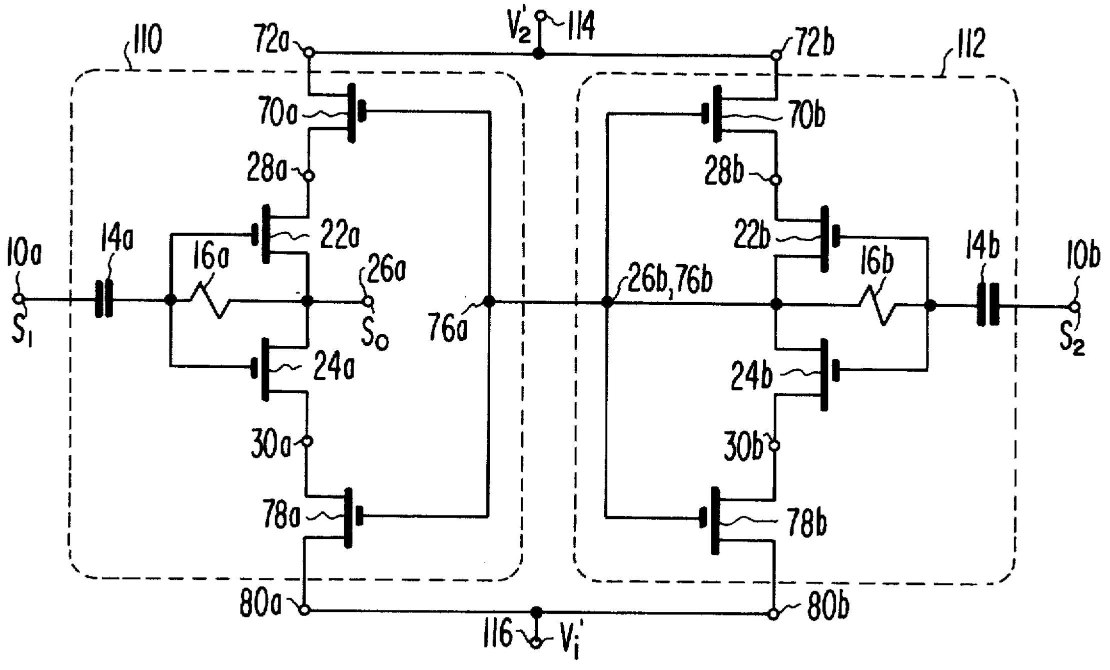
FIG. 5 is a circuit diagram of a differential amplifier embodying the invention.

In FIG. 5, the subscripted elements correspond to the like elements in FIG. 3 and amplifiers 110 and 112 each correspond to the circuit in FIG. 3. Circuit points **72*a* and 72*b* of amplifiers 110 and 112 are each connected to circuit point 114 for receiving a fixed potential $V_2'$. Circuit points 80*a* and 80*b* of amplifiers 110 and 112, respectively, are each connected to circuit point 116 for receiving a fixed potential $V_1'$. Input terminal 10*a* is adapted to receive a first input signal $S_1$ and input terminal 10*b* is adapted to receive a second input signal $S_2$. Output terminal 26*b* and control terminal 76*b* of amplifier 112, are each coupled to control terminal 76*a* of amplifier 110. Output terminal 26*a* of amplifier 110** is adapted to provide output signal $S_0$ which, as will be subsequently described, is representative of the amplified difference of input signals $S_1$ and $S_2$.

Figure 6:
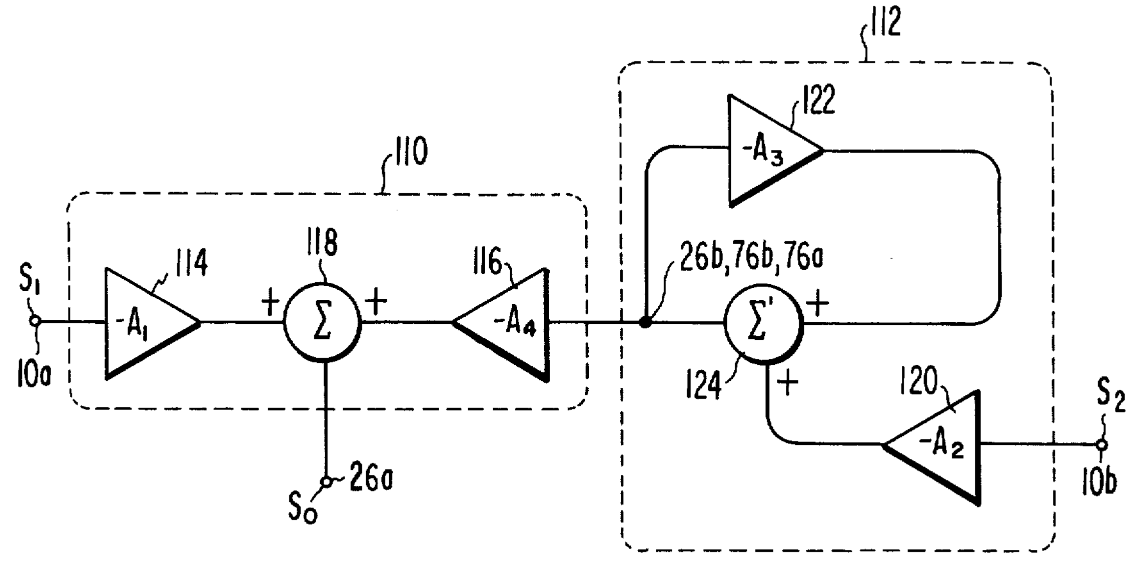
FIG. 6 is a simplified block diagram illustrating the operation of the circuit of FIG. 5.

FIG. 6 illustrates the operation of interconnected amplifiers 110, 112 of FIG. 5 to form a differential amplifier. In FIG. 6, amplifier 114 represents transistors **22*a* and 24*a* of FIG. 5. Similarly, amplifier 116 represents transistors 70*a* and 78*a* and summing point 118 corresponds to the interconnection of amplifiers 114 and 116 at circuit points 28*a* and 30*a* to produce output signal $S_0$ at output terminal 26*a*. Amplifier 120 represents transistors 22*b* and 24*b* in amplifier 112 while amplifier 122 represents transistors 70*b* and 78*b***. Summing point 124 corresponds to circuit points 28*b* and 30*b*, which effectively sum the signals produced by amplifiers 120 and 122 to produce an output signal at the common connection of output terminal 26*b* and control terminals 76*a* and 76*b*. Input terminals 10*a* and 10*b* of amplifiers 114 and 120, respectively, are adapted to receive input signals $S_1$ and $S_2$.

The operation of the differential amplifier embodied in FIG. 5 and diagrammed in FIG. 6, is as follows: assume that amplifiers 114, 116, 120 and 122 each have effective amplification factors of $-A_1$, $-A_4$, $-A_2$ and $-A_3$, respectively. To a first approximation, neglecting for example, the effect of capacitors 14*a* and 14*b*, feedback resistors 16*a* and 16*b*, and the source impedance of means supplying signals $S_1$ and $S_2$, the gain of the circuit of FIG. 5 may be calculated as follows:

$$S_o = -A_1S_1 + (A_4A_2S_2/1 + A_3) \quad (1)$$

and if, for example:

$$A_1 = A_2 = A_3 = A_4 = A \quad (2)$$

and $$A >> 1 \quad (3)$$

then $$S_o \cong A(S_2 - S_1) \quad (4)$$

From the above equations, and under the assumptions given, it is thus seen that the circuit of FIG. 5, produces an output signal $S_o$ which is related to the difference between input signals $S_1$ and $S_2$ and the effective amplification factors of each of the four pair of complementary transistors included as indicated in equation (1). Under the further assumption of equal amplification factors, all much greater than 1, as indicated in equations 2 and 3, it is seen that the output signal produced is approximately equal to the amplification factor of one of the transistor pairs times the difference between the input signals $S_2$ and $S_1$. If $S_2$ is equal to $-S_1$, the absolute value of the differential gain of the amplifier will thus be twice the effective amplification factor which was assumed.

It may be seen from equation 1 that the effective amplification factors $A_2$, $A_3$ and $A_4$ may be manipulated in other ways so that the function $A_4A_2/(1+A_3)$ may be made equal to the magnitude of $A_1$, which also would result in an equation for the differential gain of the circuit similar to equation 4. In other words, it is not necessary in the practice of the present invention, that all the amplification factors be equal, and in a given application they may, in fact, differ substantially from each other.

Equation 4 is given merely as one example of a desired operating characteristic of the present invention, as it indicates clearly the capability of the present amplifier for rejecting common mode signals. As a practical matter, however, it is apparent that the operation of the circuit depends upon, among other things, four amplification factors associated with four pair of transistors. One may expect these amplification factors to deviate from their nominal design values under normal manufacturing conditions, or when the circuit is subjected to environmental variations, in which case one cannot expect the high level of common mode rejection implicit in equation 4. If such a high level of common mode rejection is required in a given application, a plurality of circuits, such as shown in FIG. 5, may be interconnected so as to increase the overall common mode rejection ratio of the composite amplifier as shown in FIG. 7.

Figure 7:
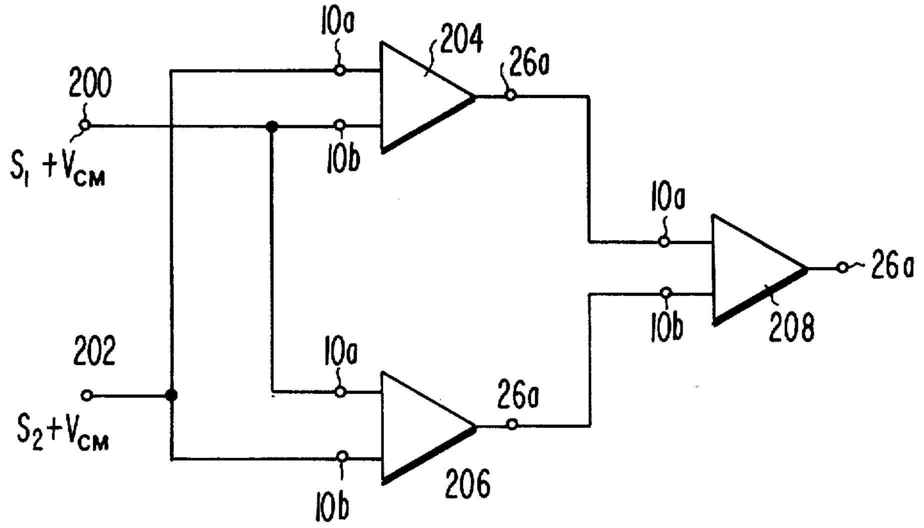
FIG. 7 is a block diagram showing interconnection of a plurality of the amplifiers of FIG. 5.

FIG. 7 includes three amplifiers, 204, 206 and 208, each corresponding to the differential amplifier of FIG. 5, wherein like numerals designate like elements. Input terminal 200 is adapted to receive an input signal $S_1$ plus a common mode voltage $V_{cm}$. Input terminal 202 is adapted to receive input signal $S_2$ plus common mode voltage $V_{cm}$. Input terminal 200 is coupled to input terminals 10b and 10a of amplifiers 204 and 206, respectively. Input terminal 202 is coupled to input terminals 10*a* and 10*b* of amplifiers 204 and 206, respectively. Output terminal 26*a* of amplifier 204 is coupled to input terminal 10*a* of amplifier 208. Output terminal 26*a* of amplifier 206 is coupled to input terminal 10*b* of amplifier 208.

If amplifiers 204, 206 and 208 are substantially identical (as for example, when integrated upon a common substrate) it may be expected that their associated common mode rejection ratios, will not appreciably differ. If input signals $S_1$ and $S_2$, each including a common mode voltage Vcm, are presented to the input terminals of amplifiers 204 and 206 as shown, those amplifiers will produce output signals having a common mode voltage reduced by the common mode rejection ratio of each of the amplifiers. This reduced common mode voltage is applied to input terminals 10a and 10b of amplifier 208, and is additionally reduced by the common mode rejection afforded by amplifier 208. While only three amplifiers have been illustrated in FIG. 7, additional pairs of amplifiers may be added to the circuit in the manner of amplifiers 204 and 206 to provide further reduction of common mode voltages.

In the preferred embodiments of the present invention, a two-input complementary field-effect transistor amplifier has been employed as a unity gain inverting amplifier, an amplifier for inverting and summing two input signals and as a differential amplifier. It has been further shown how a plurality of the differential amplifiers may be interconnected to provide improved common mode rejection. It will be appreciated by those skilled in the art that the amplifier here disclosed may be used in other applications where it is desired to produce an output signal jointly representative of two input signals or where a single input amplifier having stabilized gain is needed.

What is claimed is:

1. In combination:

a complementary field-effect transistor amplifier having an input terminal for receiving an input signal, first and second operating potential terminals for receiving first and second operating potentials, respectively, and an output terminal for producing an output signal;

first and second circuit points for receiving first and second fixed potentials, respectively;

a control voltage input terminal for receiving a control voltage;

a first variable impedance element having a conduction path connected between said first circuit point and said first operating potential terminal and having an impedance controlling electrode direct current conductively coupled to said control voltage input terminal;

a second variable impedance element having a conduction path connected between said second circuit point and said second operating potential terminal and having an impedance controlling electrode direct current conductively coupled to said control voltage input terminal; and feedback means coupling said output terminal to said input terminal for establishing said amplifier in a quiescent operating condition.

2. The combination recited in claim 1 wherein said complementary field-effect transistor amplifier comprises:

a first field effect transistor having a conduction path of a first conductivity type coupled between said first operating potential terminal and said output terminal, and having a control electrode for controlling the conduction of the path;

a second field-effect transistor having a conduction path of a second conductivity type coupled between said second operating potential terminal and said output terminal and also having a control electrode for controlling the conduction of the path; and means coupling the control electrodes of each transistor to said input terminal.

3. The combination recited in claim 2 wherein said first and second variable impedance elements comprise, respectively, third and fourth complementary field-effect transistors, the third transistor connected at its source electrode to said first circuit point and at its drain electrode to said first operating potential terminal, the fourth transistor connected at its source electrode to said second circuit point and at its drain electrode to said second operating potential terminal, and the gate electrodes of said third and fourth transistors coupled in common to said control terminal, for receiving said control voltage.

4. The combination recited in claim 3 further comprising:

means coupling said output terminal to said control terminal for providing a feedback path for signals present on said output terminal to said third and fourth complementary fieldeffect transistors.

5. The combination recited in claim 3 wherein said feedback means comprises a resistor, one end thereof coupled to said output terminal and the other end thereof coupled to said input terminal.

6. The combination recited in claim 3 wherein said feedback means comprises low-pass filter means having an input terminal thereof coupled to the amplifier output terminal and having an output terminal coupled to the amplifier input terminal.

7. The combination recited in claim 6 wherein said low-pass filter includes at least one capacitor and at least one resistor.

8. The combination recited in claim 3 further comprising:

a circuit point for initially receiving said input signal; and a capacitor coupled between said circuit point and said input terminal for conducting solely alternating current components of said input signal to said input terminal.

9. In combination:

first and second complementary-symmetry field-effect transistor amplifiers, each amplifier having first and second terminals for receiving first and second operating potentials, respectively, an input terminal for receiving an input signal and an output terminal adapted to produce an output signal representative both of said input signal and said operating potentials;

means in each amplifier for self-biasing the amplifier to a substantially linear operating condition;

first and second circuit points for receiving first and second fixed potentials, respectively;

control circuit means including a first pair of variable impedance elements, each element connected between a respective one of said first terminals and said first circuit point and a second pair of variable impedance elements, each connected between a respective one of said second terminals and said second circuit point, each element of each pair having an impedance controlling electrode direct current conductively coupled to a selected one of said output terminals.

10. The combination recited in claim 9 wherein:

said first pair of variable impedance elements comprises a first pair of field effect transistors of a first conductivity type, the source electrode of each being connected to said first circuit point and the drain electrode of each being connected to a different one of said first terminals; wherein said second pair of variable impedance elements comprises a second pair of field effect transistors of a second conductivity type, the source electrode of each being connected to said second circuit point, and the drain electrode of each being connected to a different one of said second terminals; and wherein said the gate electrode of each transistor of each said pair of transistors is connected to said selected one of said output terminals.

11. The combination recited in claim 9 wherein:

said first amplifier comprises one pair of complementary field-effect transistors, each transistor thereof having a conduction path and a control electrode for controlling the conduction of the path, the conduction paths connected in series between said first and second terminals of said first amplifier with the midpoint of the series coupled to said first amplifier output terminal and the control electrodes coupled to said first amplifier input terminal; and wherein said second amplifier comprises another pair of complementary field-effect transistors, each transistor thereof having a conduction path and a control electrode for controlling the conduction of the path, the conduction paths connected in series between said first and second terminals of said second amplifier with the midpoint of the series coupled to said second amplifier output terminal and the control electrodes coupled to said second amplifier input terminal.

12. The combination recited in claim 11 wherein said means in each amplifier for self biasing the amplifier to a substantially linear operating condition comprises:

first feedback means in said first amplifier coupled between the input and output terminals thereof; and second feedback means in said second amplifier coupled between the input and output terminals thereof.

13. The combination recited in claim 11 wherein said first and second feedback means comprise first and second resistors, respectively.

* * * * *